US005473241A

United States Patent [19]
Chen et al.

[11] Patent Number: 5,473,241
[45] Date of Patent: Dec. 5, 1995

[54] METHOD AND APPARATUS FOR RMS MEASUREMENTS IN INDUCTION MOTOR WITHOUT SAMPLING

[75] Inventors: Li Chen, Milwaukee, Wis.; Peter Unsworth, Lewes, England

[73] Assignee: Allen-Bradley Company, Inc., Milwaukee, Wis.

[21] Appl. No.: 280,272

[22] Filed: Jul. 26, 1994

[51] Int. Cl.⁶ .................................................. H02P 5/28
[52] U.S. Cl. ........................................... 318/807; 318/799
[58] Field of Search ..................................... 318/798–811

[56] References Cited

U.S. PATENT DOCUMENTS

| | | | |
|---|---|---|---|
| 3,714,533 | 1/1973 | Unnewehr | 318/138 X |
| 4,689,543 | 8/1987 | Hucker | 318/806 X |
| 4,757,242 | 7/1988 | Prather | 318/807 X |
| 4,939,437 | 7/1990 | Farag et al. | 318/806 X |
| 5,057,760 | 10/1991 | Dadpey et al. | 318/807 |

*Primary Examiner*—David S. Martin
*Attorney, Agent, or Firm*—Michael A. Jaskolski; John J. Horn; George A. Montanye

[57] ABSTRACT

A method and/or apparatus used with a motor controller for finding RMS current and RMS terminal voltage in a three phase AC induction motor using electrical values known to the controller. An equation relates average current to RMS current as a function of the duration of a known non-conducting period. Another equation relates known voltages to RMS terminal voltage as a function of a known phase angle and the known duration of the non-conducting period in a supply line.

17 Claims, 4 Drawing Sheets

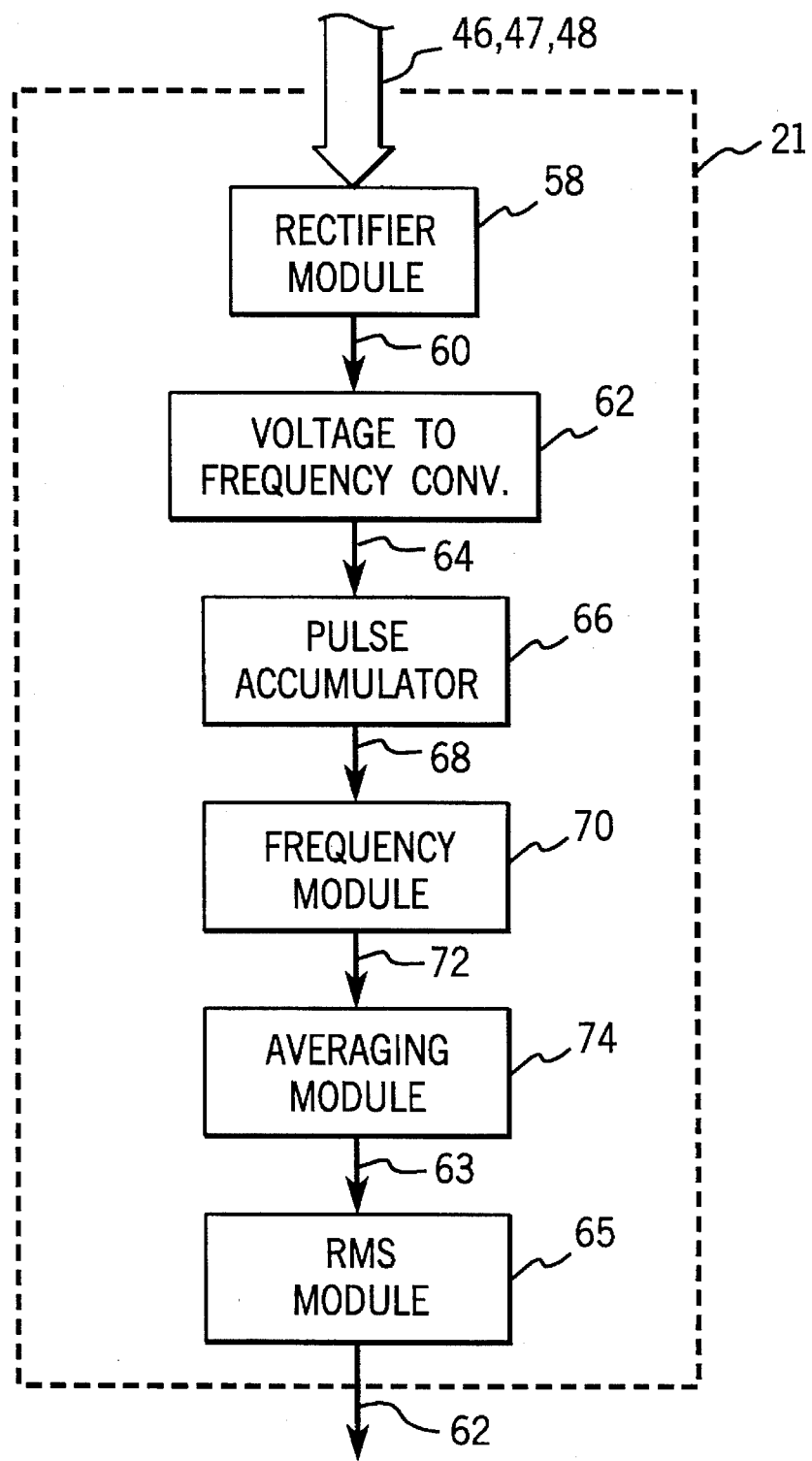

METHOD AND APPARATUS FOR RMS MEASUREMENTS IN INDUCTION MOTOR WITHOUT SAMPLING

BACKGROUND OF THE INVENTION

1. Field of the Invention

The present invention relates to a system for determining certain operating parameters of a three phase AC induction motor. More particularly, the present invention relates to a method and/or apparatus used with a motor controller which determines RMS current through and RMS motor terminal voltage across the stator windings of a motor by using electrical parameters already known to the controller and without sampling discrete currents or terminal voltages.

2. Description of the Art

One type of commonly designed induction motor is a three phase motor having three Y-connected stator windings. In this type of motor, each stator winding is connected to an AC voltage source by a separate supply line, the source generating currents therein.

Given the design of a specific AC induction motor, there is an ideal range of currents and voltages under which the motor will operate properly in steady state. Thus, if the voltage across the stator windings is too low, the motor will stall (i.e. the motor will stop rotating). If voltage across, or current through, the stator windings is too high, motor components may heat up and damage may result. Therefore, it is extremely important that both RMS current and RMS terminal voltage be monitored and if either the RMS terminal voltage or RMS current is outside the desired range, the current or voltage should be altered. Furthermore, if either RMS terminal voltage or RMS current is well outside the ideal range, the motor should be turned off until it can be properly serviced.

Most utilities which supply power to industrial motors supply well balanced purely sinusoidal three phase currents and voltages which have equal amplitudes and periods and are out of phase by exactly 120°. Because the supply currents and voltages are purely sinusoidal, it is easy to determine RMS current and voltage values in order to verify that the values are within the ideal range. However, for various reasons, systems have been developed to alter the sinusoidal current and voltage wave forms at the point of utilization.

For example, in order to start an induction motor, current many times that of the steady state current is necessary as the stationary rotor is forced into rotation. In order to control the high start-up current needed to begin rotor movement, large alternating current electric motors are often operated by a controller. Many such controllers employ separate solid state switches connecting each stator winding to one of the three supply lines. Each solid state switch is formed by either a triac or a pair of back-to-back connected silicone controlled rectifiers (SCR's), commonly referred to as a thyristor.

The thyristor based control systems operate by introducing a non-conducting period, or notch, into every half cycle of a supply line voltage. By altering the duration of the notch, the motor terminal voltages can be limited and hence the current through the stator windings can be controlled. Thus, when the motor is to be started, an equipment operator applies a starting signal to the motor controller. The motor controller then gradually increases the amount of current applied to the motor by regulating the duty cycles of the thyristors coupling each phase of electricity to the motor. In doing so, the controller turns on each thyristor initially for only a portion of each half-cycle of the A.C. voltage for the corresponding electricity phase. The controller then gradually increases the half-cycle on time of the thyristors, thus gradually increasing stator currents, until the motor is at substantially full speed. This technique reduces the current consumption and torque of the motor during start-up as compared to a hard switching of the full supply line voltage across the motor.

In a similar fashion, the thyristor based systems are used to alter current levels when motor load is changed, to control current balance, motor torque, and slippage.

While thyristor based control systems have enabled precise control of stator currents and voltages, because they operate by introducing a non-conducting period into the purely sinusoidal supply voltage and current waveforms, they make it extremely difficult to ascertain RMS current and RMS terminal voltage values.

Referring to FIGS. 2(a) and 2(b), typical stator current 31 and terminal voltage 29 waveforms can be observed. As neither of these waveforms is purely sinusoidal, RMS current and voltage determination is computationally complex.

Typically, RMS current has been determined by placing transformers on each of the voltage supply lines. Each transformer isolates a current signal from the supply voltage and steps the current down from the high value found in motors (e.g. 10–1,000 A) to a value convenient to handle for signal processing (e.g. 100 mA). Deriving true RMS current values has typically required sampling the current in each line (at least 12 samples per cycle are needed, and usually 50 or more for RMS accuracy of a few percent). Next, each sampled current value has typically been squared, the squares averaged to get a mean square value, and then the square root of the mean square calculated.

In a like fashion, determining RMS terminal voltage in a system which introduces a notch period into the supply line voltage is computationally complex. As with RMS current, sampling and computing must be done in order to determine RMS terminal voltage.

These solutions to the RMS current and RMS terminal voltage measurement problems require a large amount of computational time which limits the ability of the motor controller to monitor and control other motor parameters. One solution to this problem would be to employ a faster controller which could accommodate many more calculations in a short period. A faster controller could do the RMS calculations and, at the same time, monitor and control other motor operations. However, a faster controller would still need to sample discrete current and voltage values which might require hardware in addition to the controller and the usual controller sensors.

In addition, while a faster controller might be a partial solution for future systems, systems which are already installed could not take advantage of faster computing without being at least partially rebuilt.

Therefore, it would be valuable to have a method and/or an apparatus by which RMS current and RMS terminal voltage could be derived using information already monitored by the motor controller without costly and time consuming discrete sampling and with only a minimal number of calculations.

SUMMARY OF THE INVENTION

The present invention is a method for determining the RMS current values in the three stator windings of a three phase AC motor. The method is to be used with a motor controller which provides an alternating current in each stator winding, the controller altering an average current in each stator winding by producing a non-conducting period in each stator winding. The method comprises the steps of determining the average current through each stator winding and determining the RMS current in each stator winding from the average current and the duration of the non-conducting period in the stator winding.

Therefore, it is one object of the invention to provide a method by which a conventional motor controller can determine RMS currents in stator windings without having to perform the normal time intensive protocol of RMS calculations. By using the average current and the duration of the non-conducting period, RMS current can be determined in one calculation rather than several hundred. In this manner RMS current values can be determined without monopolizing the computing power of the motor controller and the controller can be used to monitor and regulate other motor parameters.

In a preferred method, the step of finding the average line current includes the steps of detecting the current wave form on each stator winding, generating an analog current signal representative of each current waveform, converting each analog current signal into a series of pulses, the frequency of the pulses varying with the amplitude of each current signal, determining the average pulse frequency for each series of pulses, and determining the average line current through each stator winding from the average pulse frequencies.

Thus, another object of the invention is to eliminate the need for sampling of discrete line current values in order to find average line current. In addition, in keeping with the first object of the present invention, controller computing time can be minimized by finding average line current without discrete current sampling. By converting the analog current signal into a series of pulses which can be used to find average line current, the number of calculations necessary to ultimately find RMS current is minimized.

The method of the present invention may also include the method above wherein the controller provides a cycle period and the step of determining the average pulse frequency includes the steps of counting the number of pulses during the cycle period to produce a pulse count, and dividing the pulse count by the cycle period. Thus, the average pulse frequency for each stator winding can be determined with a single calculation.

Also, in a preferred method, the controller provides a proportionality constant which relates the average pulse frequency and the average stator winding current. In this preferred method, the controller uses the proportionality constant and the average pulse frequency to determine the average current with a single calculation. The method of the present invention may also include the step of rectifying the analog current signal prior to producing the series of pulses.

Thus, each step in the method of the present invention is consistent with the broad objective of minimizing the number of calculations that need to be done by the controller which allows motor controller time to be dedicated to other motor functions.

The present invention also includes an apparatus to be used with the above described method. The apparatus includes a detector which senses the analog waveform of one stator winding current and produces an analog signal representative of the analog waveform. A convertor converts the analog signal into a series of pulses, the frequency of the pulses varying with the amplitude of the analog signal. A frequency averager receives the pulses from the converter and determines the average pulse frequency. A current averager receives the average pulse frequency and determining an average line current and an RMS current calculator receives and uses the average line current to determine RMS current in the stator winding.

A preferred apparatus of the present invention determines RMS current using a unique equation which relates RMS current to average current and the notch value provided by the controller.

In addition, the present invention includes a method to be used with a motor controller where the controller controls a three phase induction motor having three stator windings connected to separate supply lines, the controller periodically triggering solid state switches which are connected in series to each stator winding. Untriggered switches operate as open circuits and triggered switches operate as closed circuits. The controller also provides values for a power factor angle between current and voltage, a cycle period equal to the time necessary to complete one-half of a cycle of the alternating current and a notch value being the duration of a non-conducting state in terms of degrees of a cycle of the alternating current.

This method is used to determine the RMS terminal voltage for each separate stator winding. This method comprising the steps of: sensing a supply line voltage signal, determining RMS supply line voltage from the supply line voltage signal, sensing the voltage drop across the switch when non-conducting, and calculating the RMS terminal voltage using the supply line RMS voltage, the voltage drop across the switch, the power factor angle, and the notch value.

Thus, another object of the present invention is to allow RMS terminal voltage to be derived without the need for discrete terminal voltage sampling. The RMS value of the supply line voltage is easy to determine as that voltage is purely sinusoidal. The controller already monitors the voltage drop across the switch, the power factor angle, and the notch value in order to control other motor parameters. Thus, no additional sampling needs to be done in order to find the RMS terminal voltage.

In a preferred method, the step of calculating the RMS terminal voltage determines the RMS terminal voltage in a single calculation which relates the power factor angle, the notch value, the RMS supply voltage and the voltage drop across the switch to RMS terminal voltage.

Thus, another object of the invention is to limit the number of calculations that the apparatus must perform in order to determine the RMS terminal voltage. By relating RMS terminal voltage to parameters already monitored by the controller the number of calculations necessary to find RMS terminal voltage are greatly reduced. As the number of calculations necessary to determine RMS terminal voltage are reduced, motor controller time can be dedicated to other motor functions.

The invention also includes an apparatus to be used with the above described method.

In addition, the invention includes a method to be used with a motor controller, the controller controlling a three phase induction motor having three stator windings and providing an alternating current in each stator winding, the controller altering an average stator winding current in each stator winding by producing a non-conducting period in each stator winding. The controller also providing a cycle period, and a proportionality constant relating an average pulse frequency to an average current. The method is used to determine the RMS current in each stator winding. The method comprises the steps of detecting the current waveform of one stator winding current; generating an analog current signal representative of the current waveform; rectifying the analog current signal to produce a rectified signal; converting the rectified signal into a series of pulses, the frequency of said pulses varying with the amplitude of the rectified signal; counting the number of pulses during a single cycle period to produce a pulse count; dividing the pulse count by the cycle period to produce an average pulse frequency; multiplying the average pulse frequency by the proportionality constant to produce an average current value; and multiplying the average current by a function of the non-conducting period to produce an RMS current value.

This patent describes a novel method and apparatus for determining both RMS current through, and RMS terminal voltage across, the stator windings of a motor. The present invention determines both RMS current and RMS terminal voltage without the need for a complete sampling apparatus, and without monopolizing the motor controller time.

Other and further aspects of the present invention will become apparent during the course of the following description and by reference to the accompanying drawings.

BRIEF DESCRIPTION OF THE DRAWINGS

FIG. 3 is a block diagram of the current module used in the present invention;

DETAILED DESCRIPTION OF THE PREFERRED EMBODIMENT

Figure 1:
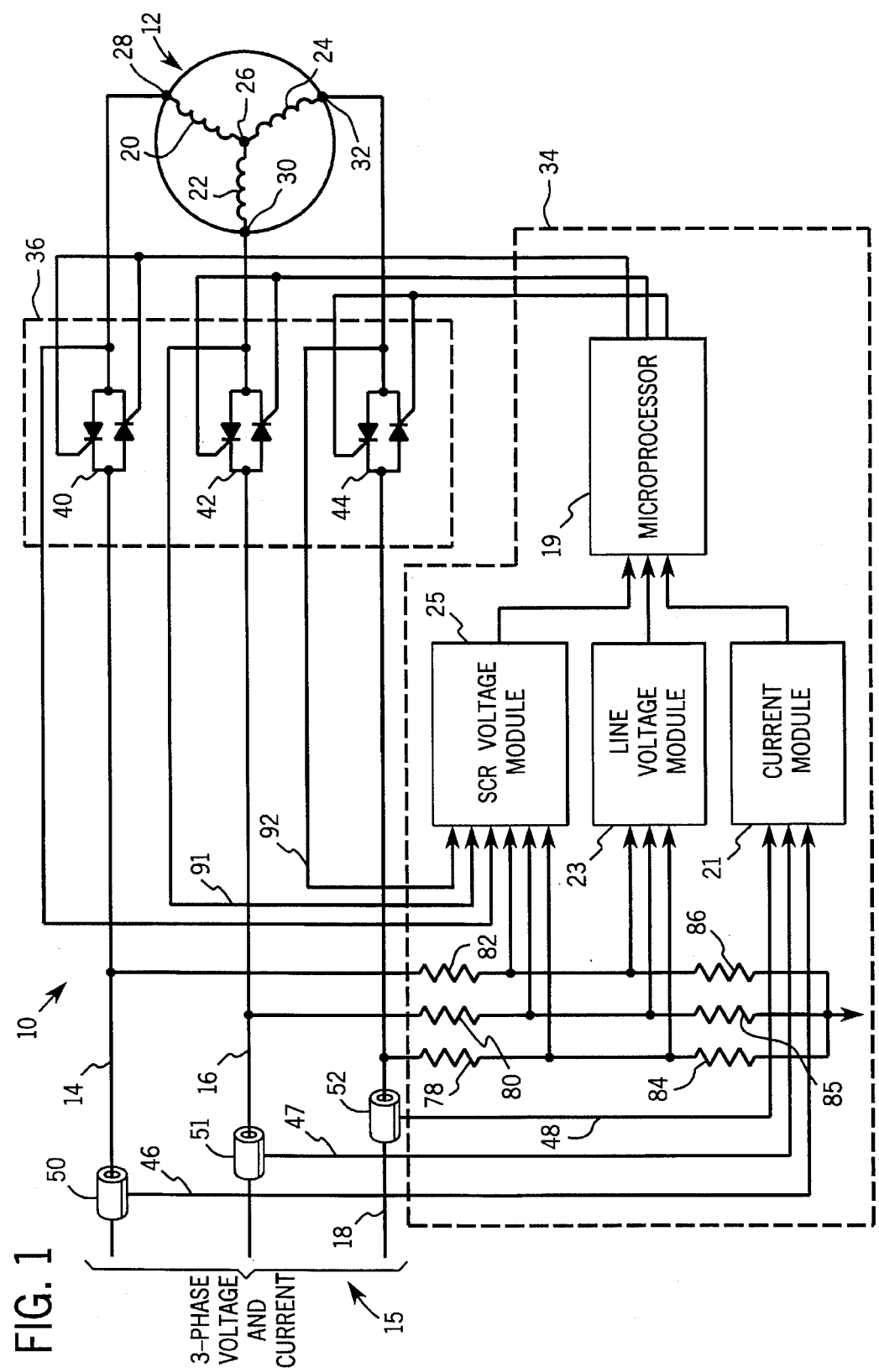
FIG. 1 is a schematic diagram of a motor and a controller which incorporates the present invention.

The present invention will be described in the context of the exemplary motor control system 10 shown in FIG. 1. The control system 10 receives three phase alternating current, determines average current ($I_{ave}$) values on each of the three phases, and uses the average current values to calculate the RMS current ($I_{rms}$) on each phase in a manner to be described below. In addition, the control system 10 receives three phase alternating supply line voltage and thyristor voltage and uses these parameters to determine RMS terminal voltage ($V_{rms}$). The three phase $I_{rms}$ and $V_{trms}$ parameters can then be used by the control system 10 to both control the motor and protect motor components from premature aging.

The induction motor 12 has three stator windings 20, 22, 24 which are coupled in a Y-configuration at neutral node 26. The distal end of each stator winding 20, 22, 24 is connected to the supply line 14, 16, 18 at a motor terminal 28, 30, 32 respectively. The phase of the voltage on supply line 14 leads the phase of the voltage on supply line 16 which in turn leads the phase voltage on supply line 18.

The motor control system 10 consists of a control module 34, a thyristor switch module 36, and a plurality of other components which will be described in more detail below. Within the control module 34, there are a plurality of sub-modules, namely a current module 21, a line voltage module 23, and an SCR voltage module 25 all of which feed information to a microprocessor 19.

The thyristor switch module 36 has three separate thyristor switches 40, 42, 44. Each thyristor switch 40, 42, 44 consists of a pair of inversely connected silicon controlled rectifiers (SCR's). Each thyristor switch 40, 42, 44 is used to control the voltage on, and current through, an associated supply line 14, 16 or 18 for altering current supplied to, and voltage across the terminals of the motor 12.

Figure 2A:
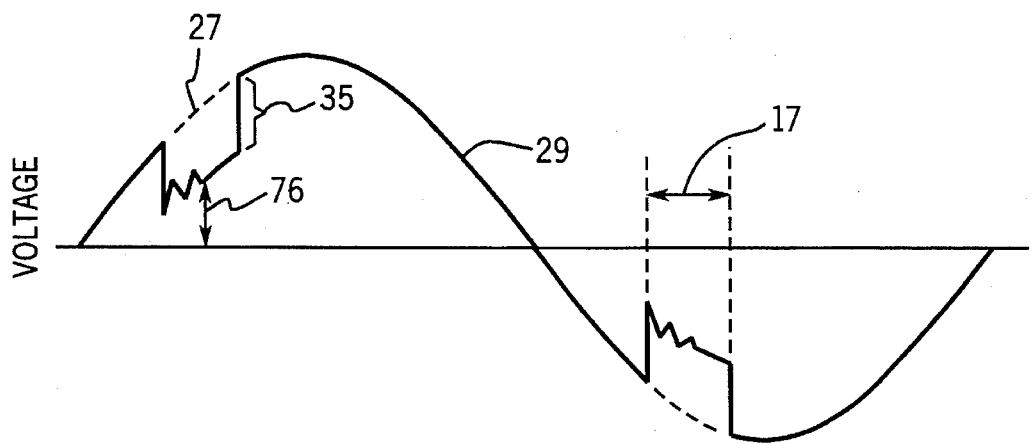
FIGS. 2(a) and 2(b) are graphs illustrating the voltage across and current through a pair of SCR's in FIG. 1 as a function of time.
Figure 2B:
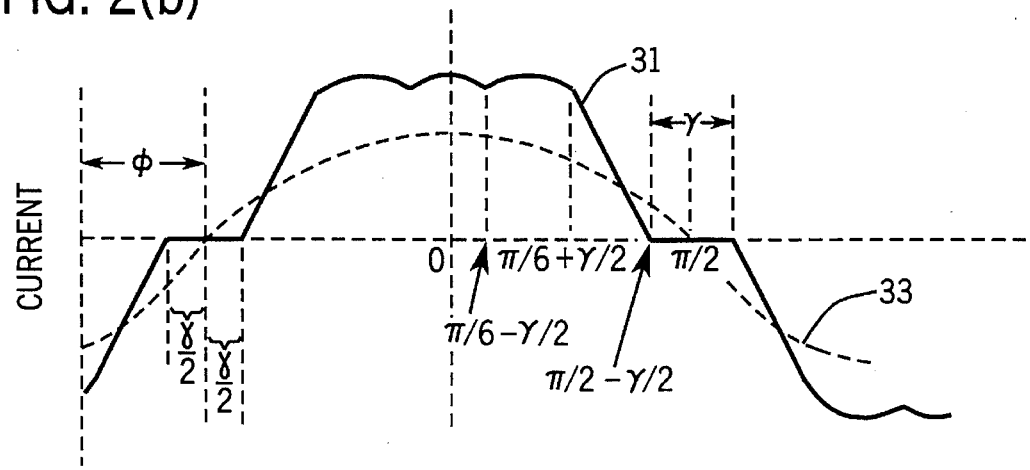

Referring also to FIGS. 2(a) and 2(b), the current and voltage on a single supply line 14, 16 or 18 may be compared to the current and voltage of the AC source 15. In FIG. 2(a), the supply voltage 27 is sinusoidal. The terminal voltage 29 is generally identical to the supply voltage 27, except for during a small non-conducting time, or notch 17 having a duration of γ, which is introduced into each half cycle of supply voltage 27. The notch 17 is introduced into the supply voltage 27 each time an associated line current 31 falls to zero. The line current 31 remains zero until the end of the notch 17, at which time the current 31 continues a pulsating waveform having a fundamental sinusoidal component 33 which generally lags the terminal voltage 29 by the angle of the power factor of the motor.

The control system 10 used with the present invention alters supply line current by controlling the period of notch 17. During the duration γ, the thyristor pair comprising one thyristor switch 40, 42 or 44 and connecting one stator winding 20, 22 or 24 to the voltage source operates as an open circuit, so that, instead of observing the sinusoidal supply voltage at the terminal 28, 30 or 32, an internally generated motor back EMF voltage may be seen. This gives the notch 17 in the observed waveform at the terminal 28, 30 or 32. While introducing the notch 17 into the waveforms of FIGS. 2(a) and 2(b) allows a user to control line current and terminal voltage, it makes it extremely difficult to derive an RMS value for current 31 through and voltage 29 across the stator winding 20, 22 or 24, as the voltage and current are clearly not sinusoidal.

RMS Current Without Sampling

In order to simplify calculation of $I_{rms}$, it has been observed that $I_{rms}$ and $I_{ave}$ in a stator winding 20, 22 or 24 can be related by some function of the duration γ such that:

$$I_{rms} = I_{ave} \cdot F(\gamma) \qquad (1)$$

Thus, $I_{rms}$ can be determined if $I_{ave}$ can be found and F(γ) can be derived.

Referring still to FIG. 1, a separate transformer 50, 51 or 52 encircles each supply line 14, 16 and 18 and isolates an analog current signal 56 and steps the current down from a high value to a value convenient to handle for signal processing. The analog signals 56 produced by the transformers 50, 51 and 52 are directed to the control module 34 along current lines 46, 47 and 48, respectively, and are received by a current module 21 therein. Once received, the current module 21 uses the signals to determine RMS current.

Referring to FIG. 3, once received within the current module 21, a rectifier module 58 makes all of the wave form segments positive, producing a rectified signal 60. The rectified signal 60 is provided to a voltage to frequency converter 62. The voltage to frequency converter 62 consists of charging and discharging a capacitor/resistor configuration as is well known in the art.

The converter 62 produces a series of identical electrical pulses 64 when a voltage is applied. The frequency of the electrical pulses 64 varies directly in relation to the amplitude of the analog signals 56. Thus, when a low voltage is applied, the pulse frequency is low. When a high voltage is applied, the pulse frequency is high. Importantly, the pulse frequency 64 produced varies directly with the amplitude of the current wave form detected on an associated supply line 14, 16 or 18.

Figure 4A:
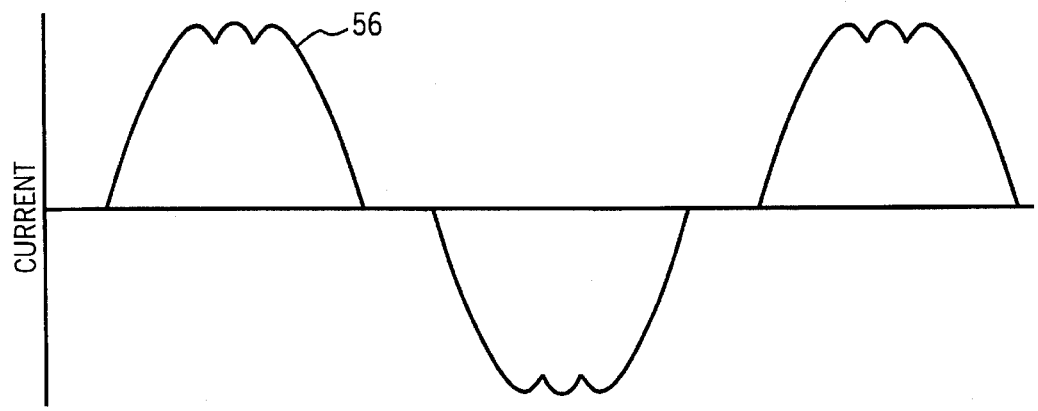
FIGS. 4(a)–4(c) are a series of graphs illustrating various signals used by the present invention.
Figure 4B:
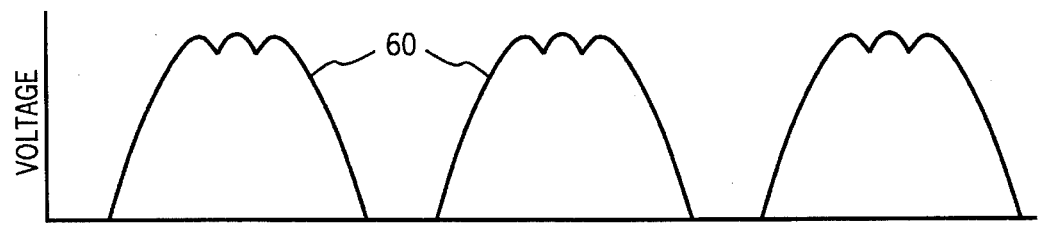
Figure 4C:
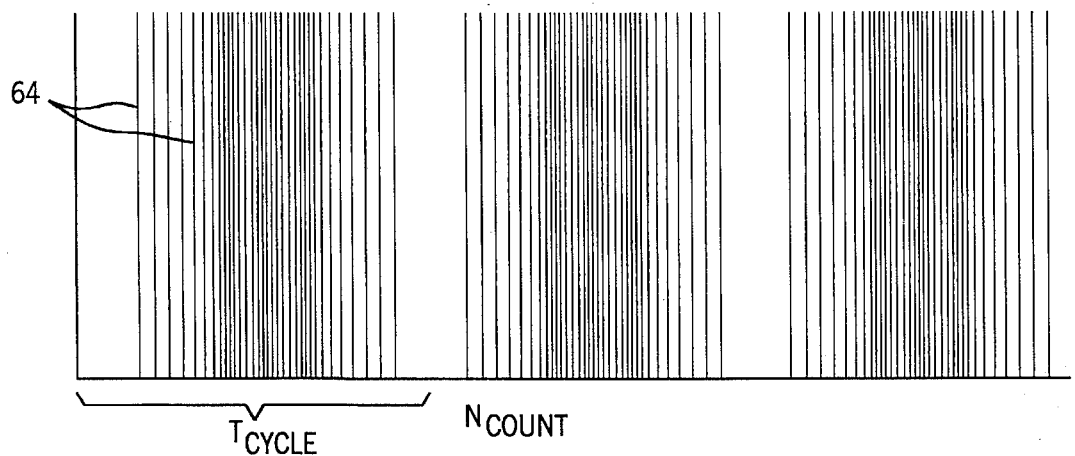

Referring to FIGS. 4(a)–4(c), an analog signal 56, rectified signal 60 and a representative pulse sequence 64 can be observed and compared. In FIG. 4(a), the analog signal 56 produced by a transformer 50, 51 or 52 is proportional to the current in an associated supply line 14, 16 or 18. The rectified signal 60 in FIG. 4(b) is simply the analog signal 56 with all segments made positive. In FIG. 4(c) the pulses 64 produced by the converter 62 are identical, and the pulse frequency varies with amplitude of the rectified signal 60.

Referring to FIGS. 3 and 4(c), a pulse accumulator 66 receives and counts the number of pulses 64 during a period corresponding to one cycle of the motor 12. It should be understood that any period may be used for this purpose. Thus, if $I_{rms}$ over a period longer than one motor cycle is desired, the cycle over which pulses are counted could be longer. The pulse count 68 and period are provided to a frequency module 70 which determines the average pulse frequency 72 according to the following equation:

$$f_{ave} = \frac{N_{count}}{T_{cycle}} \quad (2)$$

where $N_{count}$ is the number of pulses 68 and $T_{cycle}$ is the period over which $I_{rms}$ is to be found.

As the average pulse frequency 72 is directly related to the average line current, an averaging module 74 can determine $I_{ave}$ by the expression:

$$I_{ave} = K_f f_{ave} \quad (3)$$

where $K_f$ is a constant parameter for the voltage to frequency converter and is known, given the type of converter employed. Thus, $I_{ave}$, one of the two factors needed to determine $I_{rms}$ in equation 1, can be determined simply and without sampling a large number of discrete current values.

Referring again to equation 1, $I_{rms}$ can now be determined without sampling if $F(\gamma)$ can be derived. Equation 1 can be rearranged so that:

$$F(\gamma) = \frac{I_{rms}}{I_{ave}} \quad (4)$$

Thus, by finding a $\gamma$ dependent expressions for $I_{rms}$ and $I_{ave}$, an expression for $F(\gamma)$ can be obtained.

Referring again to FIG. 2(b), a portion of the current waveform on a single line 14, 16 or 18 is shown. The period for the waveform is $2\pi$. Thus, $I_{rms}$ for one period can be expressed as:

$$I_{rms} = \sqrt{\frac{1}{2\pi} \int_0^{2\pi} i^2(wt) d(wt)} \quad (5)$$

Where i is the line current. Similarly, $I_{ave}$ for one period can be expressed as:

$$I_{ave} = \frac{1}{2\pi} \int_0^{2\pi} i(wt) d(wt). \quad (6)$$

While true expressions for $I_{rms}$ and $I_{ave}$ should include an amplitude factor, the amplitude factor for both values would be identical and, for the purpose of deriving $F(\gamma)$ using equation 4, the amplitude factors would cancel. Thus, the amplitude factor has been omitted in equations 5 and 6 to simplify the $I_{rms}$ and $I_{ave}$ derivation.

Since the waveform of the current in FIG. 2(b) is symmetrical with respect to the vertical axis, equations 5 and 6 can be simplified so that:

$$I_{rms} = \sqrt{\frac{2}{\pi} \int_0^{\frac{\pi}{2}} i^2(wt) d(wt)} \quad ; \text{and} \quad (7)$$

$$I_{ave} = \frac{2}{\pi} \int_0^{\frac{\pi}{2}} i(wt) d(wt) \quad (8)$$

Referring still to FIG. 2(b), the mathematical representation of the line current has been derived and can be expressed as four segment equations as follows: t,0191

Combining equations 7 and 9–12 and simplifying $I_{rms}$ can be expressed as:

$$I_{rms} = \sqrt{\frac{2}{\pi} \int_0^{\frac{\pi}{6}-\frac{\gamma}{2}} \left( \sqrt{3} \left( \cos(wt) - 2\sin\left(\frac{\gamma}{2}\right) \right) \right)^2 d(wt) + \int_{\frac{\pi}{6}-\frac{\gamma}{2}}^{\frac{\pi}{6}+\frac{\gamma}{2}} \frac{3}{2} \left( \cos\left(wt - \frac{\pi}{6}\right) - \sqrt{3} \sin\left(\frac{\gamma}{2}\right) \right)^2 d(wt) + \int_{\frac{\pi}{6}+\frac{\gamma}{2}}^{\frac{\pi}{2}-\frac{\gamma}{2}} \sqrt{3} \left( \cos(wt) - \sin\left(\frac{\gamma}{2}\right) \right)^2} \quad (13)$$

Performing the necessary integrations and simplifying the results, $I_{rms}$ can be expressed as:

$$I_{rms} = \frac{\sqrt{3}}{2\sqrt{\pi}} \sqrt{6(\pi - \gamma) + (3\gamma - 4\pi)\cos(\gamma) - 9\sin(\gamma)} \quad (14)$$

In a like fashion, equations 8–12 can be combined, integrations and simplifications can be performed and $I_{ave}$ can be expressed as:

$$I_{ave} = \frac{\sqrt{3}}{3\pi} \left( 6\cos\frac{\gamma}{2} + (3\gamma - 4\pi)\sin\left(\frac{\gamma}{2}\right) \right) \quad (15)$$

Combining equations 4, 14 and 15, and solving for $F(\gamma)$, $F(\gamma)$ may be expressed as:

$$F(\gamma) = \frac{3\sqrt{\pi}}{2} \frac{\sqrt{6(\pi-\gamma) + (3\gamma-4\pi)\cos(\gamma) - 9\sin(\gamma)}}{6\cos(\gamma/2) + (3\gamma-4\pi)\sin(\gamma/2)} \quad (16)$$

Combining equations 1 and 16, $I_{rms}$ can be expressed as:

$$I_{rms} = \frac{I_{ave} * \frac{3\sqrt{\pi}}{2} \sqrt{6(\pi-\gamma) + (3\gamma-4\pi)\cos(\gamma) - 9\sin(\gamma)}}{6\cos(\gamma/2) + (3\gamma-4\pi)\sin(\gamma/2)} \quad (17)$$

Thus, an equation for $I_{rms}$ which depends entirely on $I_{ave}$ and the duration $\gamma$ has been derived.

Referring again to FIG. 3, an RMS module 65 receives the average line current 63 and determines the RMS current 67 according to equation 17. The amplitude factor earlier omitted is manifest in the $I_{ave}$ value figured using equation 3.

As it is the control module 34 which selects $\gamma$ during each cycle, $\gamma$ is known and can be used to find $I_{rms}$. Once $I_{rms}$ is found, it is passed on to the microprocessor 19 for further use.

The present invention also includes a method which can be used with a standard motor controller to find $I_{rms}$. In the method of the present invention, the current waveform on a line is sensed and a corresponding analog signal is produced. The analog signal is converted into a series of identical pulses, the frequency of which is indicative of the amplitude of the analog signal. The pulses are counted and the pulse number is divided by a period cycle provided by the motor controller producing an average pulse frequency. The average current is then calculated using a proportionality constant and the average pulse frequency. Next, using equation 17 and the duration $\gamma$ provided by the controller, $I_{rms}$ is calculated.

Thus, the present invention provides an accurate method and/or apparatus for determining $I_{rms}$ values without taking a large number of discrete current samples and without monopolizing the motor controllers computing power. The present invention exploits newly realized relationships between known and easily determined parameters and RMS current to limit computational time and streamline the process of determining RMS current.

RMS Terminal Voltage Without Sampling

Referring again to FIGS. 1 and 2(a), it can be seen that the terminal voltage 29 is identical to the supply line voltage 27 except for the small notch 17 where an associated switch 40, 42 or 44 is open circuited.

When a switch 40, 42 or 44 is open circuited, instead of observing the sinusoidal supply voltage at the terminal 28, 30 or 32, an internally generated motor back EMF voltage 76 may be seen. The difference between the supply line voltage 27 and the back EMF 76 is the switch voltage drop 35, across the open circuit switch 40, 42 or 44. Thus, during $\gamma$, the terminal voltage 29 equals the supply line voltage 27 less the switch voltage drop 35.

To determine the RMS terminal voltage, the terminal voltage must be integrated over one half of a cycle, thus:

$$V_{trms} = \sqrt{\frac{\int_0^{T_{180}} V_T^2(t)dt}{T_{180}}} \quad (18)$$

Where $V_T$ is the terminal voltage, $V_{trms}$ is the RMS terminal voltage, and $T_{180}$ is the period for one-half of a cycle. As $V_{trms}$, is identical to the supply line voltage 27 except for during $\gamma$, equation 18 can be rewritten as:

$$V_{trms} = \sqrt{\frac{\int_0^{T_{180}} V_T^2(t)dt + \int_{\phi-\gamma/2}^{\phi+\gamma/2} V_T^2(t)dt - \int_{\phi-\gamma/2}^{\phi+\gamma/2} V_S^2(t)dt}{T_{180}}} \quad (19)$$

Where $\Phi$ is the phase angle between current and voltage and $\gamma$ is the duration of notch 17. As the back EMF 76 is seen at the terminals 28, 30 and 32 during $\gamma$ and the back EMF is equal to the supply line voltage 27 minus the switch voltage drop 35 across an associated switch 40, 42 or 44, equation 19 can be rewritten:

$$V_{trms} = \sqrt{\frac{\int_0^{T_{180}} V_S^2(t)dt + \int_{\phi-\gamma/2}^{\phi+\gamma/2} (V_S(t)-V_{sw})^2 dt - \int_{\phi-\gamma/2}^{\phi+\gamma/2} V_S^2(t)dt}{T_{180}}} \quad (20)$$

Where $V_{sw}$ is the switch voltage drop 35. After integrating, simplifying, and rearranging terms, equation 20 can be written as:

$$V_{trms} = \quad (21)$$

$$\sqrt{V_{SRMS}^2 + \frac{\gamma}{T_{180}}*V_{SW}^2 - \frac{4\sqrt{2}}{T_{180}}*V_{SRMS}*V_{SW}*\sin\left(\frac{\gamma}{2}\right)*\sin(\phi)}$$

Where $V_{srms}$ is the RMS source voltage. Thus, $V_{trms}$ can be expressed solely as a function of the RMS supply voltage $V_{srms}$, switch voltage drop $V_{sw}$, phase angle $\Phi$, and duration $\gamma$. $V_s$ and $V_{sw}$ are both monitored by a standard motor controller 34. $V_{srms}$ can easily be determined from $V_s$ as $V_s$ is purely sinusoidal. In addition, $\gamma$ and $\Phi$ are parameters controlled by, and thus known to, the control module 34.

Referring again to FIG. 1, most motor controllers 34 directly monitor $V_s$ and $V_{sw}$. In the embodiment shown, each supply line 14, 16 or 18 is coupled by a separate resistor 78, 80 or 82 to the inputs of the line voltage module 23. Three additional resistors 84, 85 and 86 couple the inputs of the line voltage module 23 to a control circuit ground, thereby forming voltage dividers with resistors 78, 80 and 82. Thus, the signals at the line voltage module 25 inputs are indicative of the voltages on associated supply lines 14, 16 and 18. These line voltage signals are also provided to three of the inputs to the SCR voltage module 25 and act as reference voltages for determining SCR voltage drops.

Lines 90, 91 and 92 are connected to motor terminals 28, 30 and 32 and provide signals to the SCR voltage module indicative of the voltage drops across associated switches 40, 42 and 44.

Thus, the switch voltage drops 35 and line voltage levels 27 seen in FIGS. 2(*a*) and 2(*b*) are easily measured by standard motor controllers. These are the values used in equation 22 to determine $V_{trms}$. The microprocessor 19, uses equation 22 to find $V_{trms}$.

The present invention also includes a method of determining RMS terminal voltage. After RMS supply line voltage and the switch voltage drop 31 across an associated switch 40, 42 or 44 is determined, equation 21 can be used to determine RMS terminal voltage in a single step.

The functionality of the control module 34 can also be implemented in software and used with already existing control modules 34. For example, as most smart motor controllers already monitor currents with transformers and supply voltages and voltage drops across associated solid sate switches, and most controllers control, and thus know, $\gamma$ and $\Phi$ values, the control module microprocessor 19 can be used with the equations of the present invention to find $I_{rms}$ and $V_{trms}$ without additional sampling and with minimal calculations, thus freeing up the motor controller 34 to monitor and control other motor operations.

It should be understood that the above described embodiments are simply illustrative of the principles of this invention. Various other modifications and changes may be made by those skilled in the art which will embody the principals of the invention and fall within the spirit and scope thereof. For example, the analog current signals might be sensed with a current sensor other than a transformer. In addition, equations 2, 3, and 17 may be combined so that a single module can take the pulse count, the proportionality constant, the cycle period and duration $\gamma$, and in one calculation, find $I_{rms}$. Also, while transformers 50, 51 and 51 are positioned near the supply 15 in FIG. 1, they could be placed anywhere along their associated supply lines 14, 16 and 18 as the current waveform through any given line is identical along its length. In addition, while one manner of determining average line current is disclosed, any manner of making such a determination may be used with the present invention. Furthermore, the periods for which RMS current and voltage are determined can be multiples or fractions of a motor cycle period.

We claim:

1. A method for determining the RMS current in at least one induction motor winding, the RMS current being used for motor control purposes, the method to be used with a motor controller, the controller controlling the motor by providing an alternating current in each stator winding, the controller altering an average stator winding current in each stator winding by producing a non-conducting period in each stator winding, the method comprising the steps of:

(a) determining the average current through one of said stator windings; and (b) determining the RMS current in said one stator winding from the average current in said one stator winding and a duration of said non-conducting period in said one stator winding.

2. The method recited in claim 1 wherein the step of determining the average current through said one stator winding includes the steps of:

detecting the current wave form on said one stator winding;

generating an analog current signal representative of said current wave form;

converting said analog current signal into a series of pulses, the frequency of said pulses varying with the amplitude of the analog current signal;

determining an average pulse frequency for said series of pulses; and determining an average current through said stator winding from the average pulse frequency.

3. The method as recited in claim 2 wherein the controller provides a cycle period and the step of determining the average pulse frequency includes the steps of counting the number of pulses during the cycle period to produce a pulse count, and dividing the pulse count by the cycle period.

4. The method as recited in claim 3 wherein the cycle period is the time it takes to complete one cycle of the alternating current.

5. The method as recited in claim 2 further including the step of rectifying the analog current signal prior to producing the series of pulses.

6. The method as recited in claim 2 wherein the controller provides a proportionality constant which relates the average pulse frequency and the average stator winding current, and said step of determining the average current derives the average current according to the expression:

$$I_{ave} = K_f f_{ave}$$

where $I_{ave}$ is the average stator current, $f_{ave}$ is the average pulse frequency, and $K_f$ is the proportionality constant.

7. The method as recited in claim 2 wherein the controller provides the non-conducting period in terms of degrees of a cycle of the alternating current, and said step of determining the RMS current derives the RMS current according to the expression:

$$I_{rms} = I_{ave} * \frac{3\sqrt{\pi}}{2} * \frac{\sqrt{6(\pi - \gamma) + (3\gamma - 4\pi)\cos(\gamma) - 9\sin(\gamma)}}{6\cos(\gamma/2) + (3\gamma - 4\pi)\sin(\gamma/2)}$$

where $\gamma$ is the non-conducting period, $I_{ave}$ is the average status winding current, notch value and $I_{rms}$ is the RMS current.

8. The method as recited in claim 1 wherein the motor includes three stator windings and the steps listed are all performed for each of the three stator windings, producing distinct RMS current values for each of the three stator windings.

9. An apparatus for determining the RMS current in induction motor windings, the RMS current being used for motor control, the apparatus to be used with a motor controller, the controller controlling the motor by providing an alternating current in each stator winding, the apparatus comprising:

a detector sensing the analog waveform of one stator winding current and producing an analog signal representative of the analog waveform;

a converter to convert the analog signal into a series of pulses, the frequency of said pulses varying with the amplitude of the analog signal;

a frequency averager receiving the pulses from the converter and determining an average pulse frequency;

a current averager receiving the average pulse frequency and determining an average line current; and an RMS current calculator receiving and using the average line current to determine RMS current in the stator winding.

10. The apparatus as recited in claim 9 wherein the controller provides a cycle period and the frequency averager includes a pulse accumulator which counts the number of pulses during the cycle period producing a pulse count and a divider which divides the pulse count by the cycle period to produce the average pulse frequency.

11. The apparatus as recited in claim 9 wherein the controller provides a proportionality constant which relates the average pulse frequency to the average stator winding current and the current averager determines the average current according to the expression:

$$I_{ave} = K_f f_{ave}$$

where $I_{ave}$ is the average stator current, $f_{ave}$ is the average pulse frequency, and $K_f$ is the proportionality constant.

12. The apparatus as recited in claim 9 wherein the controller provides a notch value, the notch value being the duration of a non-conducting state in the stator winding in terms of degrees of a cycle of the alternating current, and the RMS current calculator determines the RMS current according to the expression:

$$I_{rms} = I_{ave} * \frac{3\sqrt{\pi}}{2} * \frac{\sqrt{6(\pi-\gamma)+(3\gamma-4\pi)\cos(\gamma)-9\sin(\gamma)}}{6\cos(\gamma/2)+(3\gamma-4\pi)\sin(\gamma/2)}$$

where $\gamma$ is the notch value, $I_{ave}$ is the average current, and $I_{rms}$ is the RMS current.

13. A method for determining the RMS terminal voltage for at least one motor winding, the RMS terminal voltage being used for motor control, the method to be used with a motor controller, the controller controlling the motor by periodically triggering solid state switches which are connected in series to each stator winding, untriggered switches operating as open circuits and triggered switches operating as closed circuits, the controller also providing a power factor angle between current and voltage, a cycle period equal to the time necessary to complete one-half of a cycle of the alternating current, and a notch value being the duration of a non-conducting state in terms of degrees of a cycle of the alternating current, the method comprising the steps of:

sensing a supply line voltage signal;

determining RMS supply line voltage from the supply line voltage signal;

sensing the voltage drop across said solid state switch; and calculating the RMS terminal voltage using the supply line RMS voltage, the voltage drop across the solid state switch, the power factor angle, and said notch.

14. The method as recited in claim 13 wherein said step of calculating the RMS terminal voltage derives the RMS terminal voltage according to the expression:

$$V_{trms} = \sqrt{V_{SRMS}^2 + \frac{\gamma}{T_{180}} * V_{sw}^2 - \frac{4\sqrt{2}}{T_{180}} * V_{SRMS} * V_{sw} * \sin\left(\frac{\gamma}{2}\right) * \sin(\phi)}$$

where $\gamma$ is the notch value, $T_{180}$ is the cycle period, $V_{TRMS}$ is the RMS motor terminal voltage, $V_{sw}$ is the switch voltage, $V_{SRMS}$ is the RMS supply voltage, and ($\phi$) is the power factor angle between supply line voltage and a supply line current.

15. An apparatus for determining the RMS terminal voltage for motor windings, RMS terminal voltage being used for motor control, the apparatus to be used with a motor controller, the controller controlling the motor by periodically triggering solid state switches which are connected in series to each stator winding, untriggered switches operating as open circuits and triggered switches operating as closed circuits, the controller also providing a power factor angle between current and voltage, a cycle period equal to the time necessary to complete one-half of a cycle of the alternating current, and a notch value being the duration of a non-conducting state in terms of degrees of a cycle of the alternating current, the apparatus comprising:

a first detector for sensing a supply line voltage signal;

a supply calculator which receives and uses the supply line voltage signal to determine the RMS supply line voltage;

a second detector for determining the voltage drop across the solid state switch; and an RMS terminal voltage calculator receiving and using both the supply line RMS voltage, the voltage drop across the solid state switch to determine the RMS terminal voltage, the power factor angle, and said notch.

16. The apparatus as recited in claim 15 wherein said step of calculating the RMS terminal voltage derives the RMS terminal voltage according to the expression:

$$V_{TRMS} = \sqrt{V_{SRMS}^2 + \frac{\gamma}{T_{180}} * V_{Thy}^2 - \frac{4\sqrt{2}}{T_{180}} * V_{SRMS} * V_{Thy} * \sin\left(\frac{\gamma}{2}\right) * \sin(\phi)}$$

where $\gamma$ is the notch value, $T_{180}$ is the cycle period, $V_{TRMS}$ is the RMS motor terminal voltage, $V_{sw}$ is the thyristor voltage, $V_{SRMS}$ is the RMS supply voltage, and $\Phi$ is the power factor angle between supply line voltage and a supply line current.

17. A method for determining the RMS terminal voltage for motor windings, the RMS terminal voltage being used for motor control, the method to be used with a motor controller, the controller controlling the motor by alternating an average stator winding by producing a non-conducting period in each stator winding, the controller also providing a cycle period and a proportionality constant relating an average pulse frequency to an average current, the method comprising the steps of:

detecting the current waveform in a single stator winding;

generating an analog current signal representative of the current waveform;

rectifying the analog current signal to produce a rectified signal;

converting the rectified signal into a series of pulses, the frequency of said pulses varying with the amplitude of the rectified signal;

counting the number of pulses during a single cycle period to produce a pulse count;

dividing the pulse count by the cycle period to produce an average pulse frequency;

determining the average current through the stator winding from the average pulse frequency according to the expression:

$$I_{ave} = K_f f_{ave}$$

where $I_{ave}$ is the average current through the stator winding, $f_{ave}$ is the average pulse frequency, and $K_f$ is the proportionality constant relating the average current and the average pulse frequency; and determining the RMS current in the stator winding according to the expression:

$$I_{rms} = I_{ave} * \frac{3\sqrt{\pi}}{2} * \frac{\sqrt{6(\pi-\gamma)+(3\gamma-4\pi)\cos(\gamma)-9\sin(\gamma)}}{6\cos(\gamma/2)+(3\gamma-4\pi)\sin(\gamma/2)}$$

where $\gamma$ is a duration of the a non-conducting period in the stator winding, $I_{ave}$ is the average stator winding current, and $I_{rms}$ is the RMS current.

* * * * *